(12) United States Patent
Xu et al.

(10) Patent No.: US 11,489,437 B2
(45) Date of Patent: Nov. 1, 2022

(54) DC INVERTER/CONVERTER CURRENT BALANCING FOR PARALLELED PHASE LEG SWITCHES

(71) Applicant: FORD GLOBAL TECHNOLOGIES, LLC, Dearborn, MI (US)

(72) Inventors: Zhuxian Xu, Novi, MI (US); Chingchi Chen, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 17/352,514

(22) Filed: Jun. 21, 2021

(65) Prior Publication Data
US 2021/0313906 A1 Oct. 7, 2021

Related U.S. Application Data

(63) Continuation of application No. 16/416,548, filed on May 20, 2019, now Pat. No. 11,075,589.

(51) Int. Cl.
| | |
|---|---|
| *H02M 1/088* | (2006.01) |
| *H02M 7/5387* | (2007.01) |
| *H02M 1/08* | (2006.01) |
| *H02P 27/08* | (2006.01) |
| *B60K 6/22* | (2007.10) |

(Continued)

(52) U.S. Cl.
CPC .............. *H02M 1/088* (2013.01); *H02M 1/08* (2013.01); *H02M 7/53871* (2013.01); *H02P 27/08* (2013.01); *B60K 6/22* (2013.01); *B60L 50/00* (2019.02); *B60Y 2200/91* (2013.01); *B60Y 2200/92* (2013.01); *B60Y 2400/61* (2013.01); *H02M 7/493* (2013.01)

(58) Field of Classification Search
CPC ...... H02M 7/53871; H02M 1/08; H02P 27/08; B60L 50/00; B60Y 2200/92; B60Y 2400/61

See application file for complete search history.

(56) References Cited

U.S. PATENT DOCUMENTS

| | | | |
|---|---|---|---|
| 6,084,790 A | 7/2000 | Wong | |
| 6,400,116 B1 * | 6/2002 | Chen | H02P 6/10 318/400.14 |

(Continued)

OTHER PUBLICATIONS

Jovanović, et al, Current-balancing technique for paralleled interleaved inverters with magnetically coupled inductors, 789-794, 2017 IEEE 12th International Conference on Power Electronics and Drive Systems.

*Primary Examiner* — Zoheb S Imtiaz
(74) *Attorney, Agent, or Firm* — David B. Kelley; MacMillan, Sobanski & Todd, LLC

(57) ABSTRACT

Current imbalances between parallel switching devices in a power converter half leg are reduced. A gate driver generates a nominal PWM gate drive signal for a respective half leg. A first feedback loop couples the nominal PWM gate drive signal to a gate terminal of a respective first switching device. The first feedback loop has a first mutual inductance with a current path of a first parallel switching device and has a second mutual inductance with a current path of a second parallel switching device. The first and second mutual inductances are arranged to generate opposing voltages in the first feedback loop, so that when all the parallel switching devices carry equal current then the voltages cancel.

16 Claims, 9 Drawing Sheets

(51) Int. Cl.
  *B60L 50/00* (2019.01)
  *H02M 7/493* (2007.01)

(56) References Cited

U.S. PATENT DOCUMENTS

| | | |
|---|---|---|
| 8,446,206 B2 | 5/2013 | Alvarez Valenzuela et al. |
| 9,343,991 B2 | 5/2016 | Wagoner et al. |
| 9,584,116 B2 | 2/2017 | Mao et al. |
| 10,187,050 B2 | 1/2019 | Mao et al. |
| 2014/0203559 A1 | 7/2014 | Wagoner et al. |
| 2015/0022129 A1* | 1/2015 | Lu .......................... H02P 6/20 |
| | | 318/400.11 |

* cited by examiner

DC INVERTER/CONVERTER CURRENT BALANCING FOR PARALLELED PHASE LEG SWITCHES

CROSS REFERENCE TO RELATED APPLICATIONS

This application is a continuation of U.S. application Ser. No. 16/416,548, filed May 20, 2019.

STATEMENT REGARDING FEDERALLY SPONSORED RESEARCH

Not Applicable.

BACKGROUND OF THE INVENTION

The present invention relates in general to power converters using a plurality of parallel switching devices in a half leg of a phase leg to increase current capacity, and, more specifically, to automatically adjusting a gate drive signal to individual switching devices in response to imbalances of current carried by different ones of the parallel switching devices.

Electrified vehicles, such as hybrid electric vehicles (HEVs), plug-in hybrid electric vehicles (PHEVs), and battery electric vehicles (BEVs), use inverter-driven electric machines to provide traction torque. A typical electric drive system includes a DC power source (such as a battery pack or a fuel cell) coupled by contactor switches to a variable voltage converter (VVC) to regulate a main bus voltage across a main DC link capacitor. An inverter is connected between the main buses for the DC link and a traction motor in order to convert the DC power to an AC power that is coupled to the windings of the motor to propel the vehicle. A generator inverter may also be connected to the DC link so that AC power from a generator driven by an internal combustion engine can supply DC power onto the link for recharging the battery and/or powering the traction motor.

The inverter(s) and VVC include transistor switching devices (such as insulated gate bipolar transistors, or IGBTs) connected in a bridge configuration including one or more phase legs. A typical configuration includes a three-phase motor driven by an inverter with three phase legs. An electronic controller turns the switches on and off in order to invert a DC voltage from the bus to an AC voltage applied to the motor. The inverter is controlled in response to various sensed conditions including the rotational position of the electric machine and the current flow in each of the phases.

The inverter for the motor may preferably pulse-width modulate the DC link voltage in order to deliver an approximation of a sinusoidal current output to drive the motor at a desired speed and torque. Pulse Width Modulation (PWM) control signals are applied to drive the gates of the IGBTs in order to turn them on and off as necessary. In an idealized form, the gate drive control signals are square wave signals that alternate each power switching device (e.g., IGBT) between a fully off and a fully on (saturated) state. During turn off and turn on, it takes time for the device to respond to the change in the gate drive signal. For example, after the gate drive signal transitions from a turn-off state to a turn-on state, conduction through the device output transitions from zero current flow to a maximum current flow within a few microseconds.

Common source inductance refers to an inductance shared by the main power loop (i.e., the drain-to-source or collector-to-emitter power output of the transistor) and the gate driver loop (i.e., gate-to-source or gate-to-emitter) in a power switching transistor. The common source inductance carries both the device output current (e.g., drain to source current) and the gate charging/discharging current. A current in the output (power loop) portion of the common source inductance modifies the gate voltage in a manner that reinforces (e.g., speeds up) the switching performance. For a switching bridge, the reduced switching time may be desirable since it may have an associated reduction in the energy consumed (i.e., lost) during the switching transition. The magnitude of the gate loop inductance and/or the power loop inductance and the degree of mutual coupling between them can be easily manipulated (e.g., enhanced) by selecting an appropriate layout and/or including added overlapping coils in PCB traces forming conductive paths to the transistor gates or emitters in order to obtain a desired common source inductance.

Since the current-carrying capacity or power capacity of a power transistor such as an IGBT may be less than a desired maximum load current, inverters for electrified vehicles may often use a plurality of paralleled transistors for the upper and/or lower half legs of each phase leg to increase the current handling capability. Typically, the paralleled transistors would be substantially identical (e.g., the same IGBT). The paralleled transistors may all be controlled by the same gate drive signal so that they all turn on and off simultaneously.

Once the paralleled devices have turned on, however, normal variations in device parameters can cause unbalanced current sharing between them. For example, a variation in the gate threshold voltage of an IGBT as small as 1V can result in a difference in the output currents of hundreds of amps. A switching device carrying a higher current will accordingly have high switching loss.

SUMMARY OF THE INVENTION

In one aspect of the invention, a pulse width modulated (PWM) power converter comprises a DC link with positive and negative buses configured to receive a DC supply voltage. A phase leg comprising an upper half leg and a lower half leg is coupled in series between the buses, wherein a junction between the half legs is configured to be coupled to a load. Each half leg is comprised of first and second switching devices connected in parallel. A gate driver generates a nominal PWM gate drive signal for a respective half leg. A first feedback loop couples the nominal PWM gate drive signal to a gate terminal of a respective first switching device. The first feedback loop has a first mutual inductance with a current path of the respective first switching device and has a second mutual inductance with a current path of the respective second switching device. The first and second mutual inductances are arranged to generate opposing voltages in the first feedback loop, whereby inequalities in current magnitudes of the respective first and second switching devices are reduced.

A feedback loop can further include an additional mutual inductance with the power loop current of the matching switching device (i.e., the switching device controlled via the feedback loop) having a magnitude selected to shorten the transition time of the switching device to reduce switching loss.

DETAILED DESCRIPTION OF PREFERRED EMBODIMENTS

Figure 1:
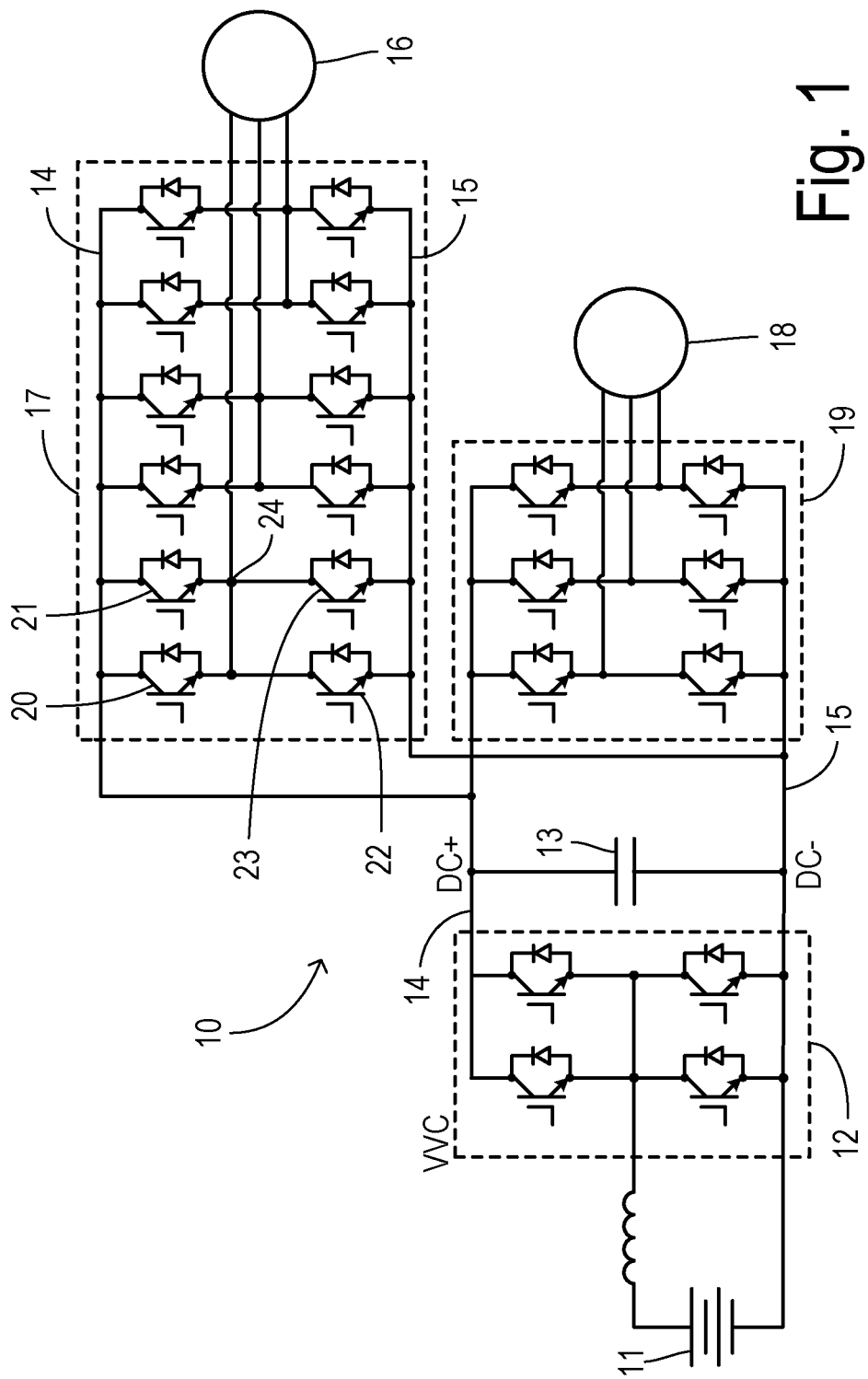
FIG. 1 is a schematic diagram showing an electric drive portion of a hybrid electric vehicle of a type for adopting the present invention.

Referring to FIG. 1, an electric drive section 10 of an electrified vehicle includes a battery 11 coupled by contactor relay switches (not shown) to a variable voltage converter (VVC) 12. VVC 12 includes an upper switching device and a lower switching device (e.g., insulated gate bipolar transistors or IGBTs) connected in series between a positive DC bus 14 and a negative DC bus 15. A main DC linking capacitor 13 is connected buses 14 and 15. VVC 12 typically performs a DC-DC conversion between a supply voltage of battery 11 and a higher DC link voltage adapted for operating with a motor 16 and a generator 18. A motor inverter 17 and a generator inverter 19 are coupled between buses 14 and 15. Inverters 17 and 19 are each comprised of a plurality of switching devices in a bridge configuration.

For example, inverter 17 has a first phase leg including IGBTs 20 and 21 in an upper half leg and IGBTs 22 and 23 in a lower half leg. The parallel combination of the IGBTs in the upper and lower half legs are connected in series between buses 14 and 15, and a junction 24 between the half legs is connected to one phase winding of motor 16. The switching devices in the other phase legs are similarly connected. The switching devices in inverters 17 and 19 and in VVC 12 are driven according to control signals from a controller and gate driver (not shown) in a conventional manner (e.g., using pulse width modulation).

Figure 2:
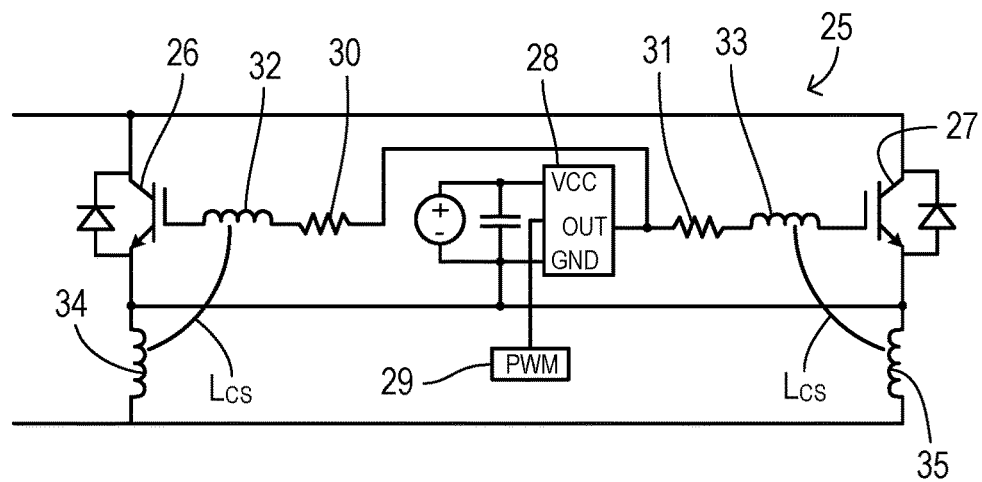
FIG. 2 is a schematic diagram of two parallel phase leg transistors sharing a common gate drive signal for switching simultaneously.

The use of two or more IGBTs in parallel for each half leg achieves higher output power. Conventionally, the paralleled IGBTs typically have shared the same gate driving signals as shown in FIG. 2 wherein a half leg 25 (which can be either an upper or lower half leg in any of the phase legs) has a first IGBT 26 and a second IGBT 27 driven by a gate driver 28. Driver 28 receives a PWM timing signal from a PWM controller 29. An output of driver 37 is coupled to the gate terminals of IGBTs 26 and 27 by respective gate resistors 30 and 31 in series with respective gate inductances 32 and 33 which are coupled to respective power loop (e.g., emitter) inductances 34 and 35. The mutual inductance between the gate and emitter terminals of each IGBT 26 and 27 is referred to as a common source inductance $L_{CS}$. Although two paralleled switching transistors are shown in FIG. 2, a greater number of devices may typically be used, depending on the current ratings of the selected transistor device and on the maximum current load.

Common source inductance is an inductance shared by a main power loop and a gate driver loop for a transistor switching device. It usually arises from parasitic inductances associated with the device packaging and traces on printed circuit boards. In the context of switching bridges used for DC to AC power conversion, the presence of common source inductance can be beneficial. The magnitude of the gate loop inductance and/or the power loop inductance and the degree of mutual coupling between them can be easily manipulated (e.g., enhanced) by selecting an appropriate layout and/or including added overlapping coils in PCB traces forming conductive paths to the transistor gates or emitters in order to obtain a desired common source inductance. For example, the common source inductance can be enhanced as described in U.S. Pat. No. 10,250,115, issued Apr. 2, 2019, entitled "Inverter Switching Devices with Common Source Inductance Layout to Avoid Shoot-Through," which is incorporated herein by reference.

Figure 3A:
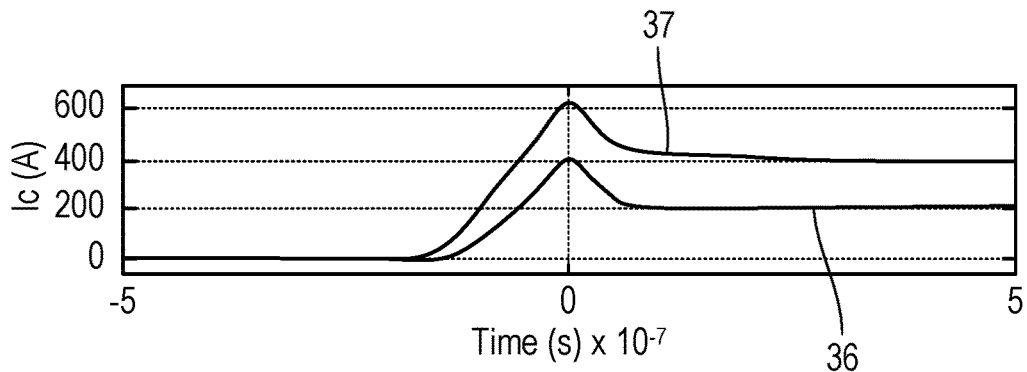
FIGS. 3A and 3B are graphs showing unbalanced current and switching loss, respectively, for unbalanced phase leg transistors.
Figure 3B:
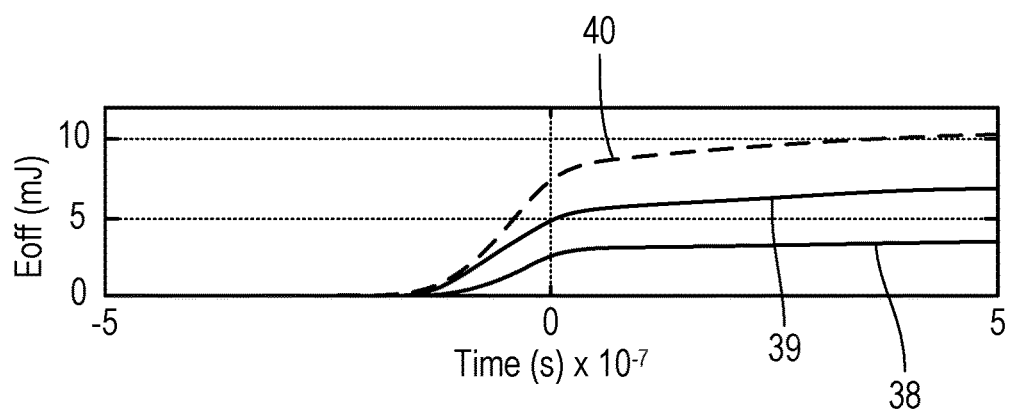

When IGBTs 26 and 27 are switched on simultaneously using an identical gate drive signal, a difference in their gate threshold voltages can result in an unequal (unbalanced) sharing of the total current load. FIG. 3A shows output current (i.e., collector current $I_C$) before and after turning on of two switching devices wherein a line 36 shows current from first switching device and a line 37 shows an elevated current from a second switching device. The current unbalance is over 200 amps. FIG. 3B shows the cumulative energy dissipation ($E_{ON}$) measured in millijoules. Line 38 corresponds to the first switching device, line 39 corresponds to the second switching device, and line 40 shows the sum of the dissipated energy for both devices. Balancing the current sharing between the switching devices would result in a lower total dissipation of energy (i.e., lower switching loss).

Figure 4:
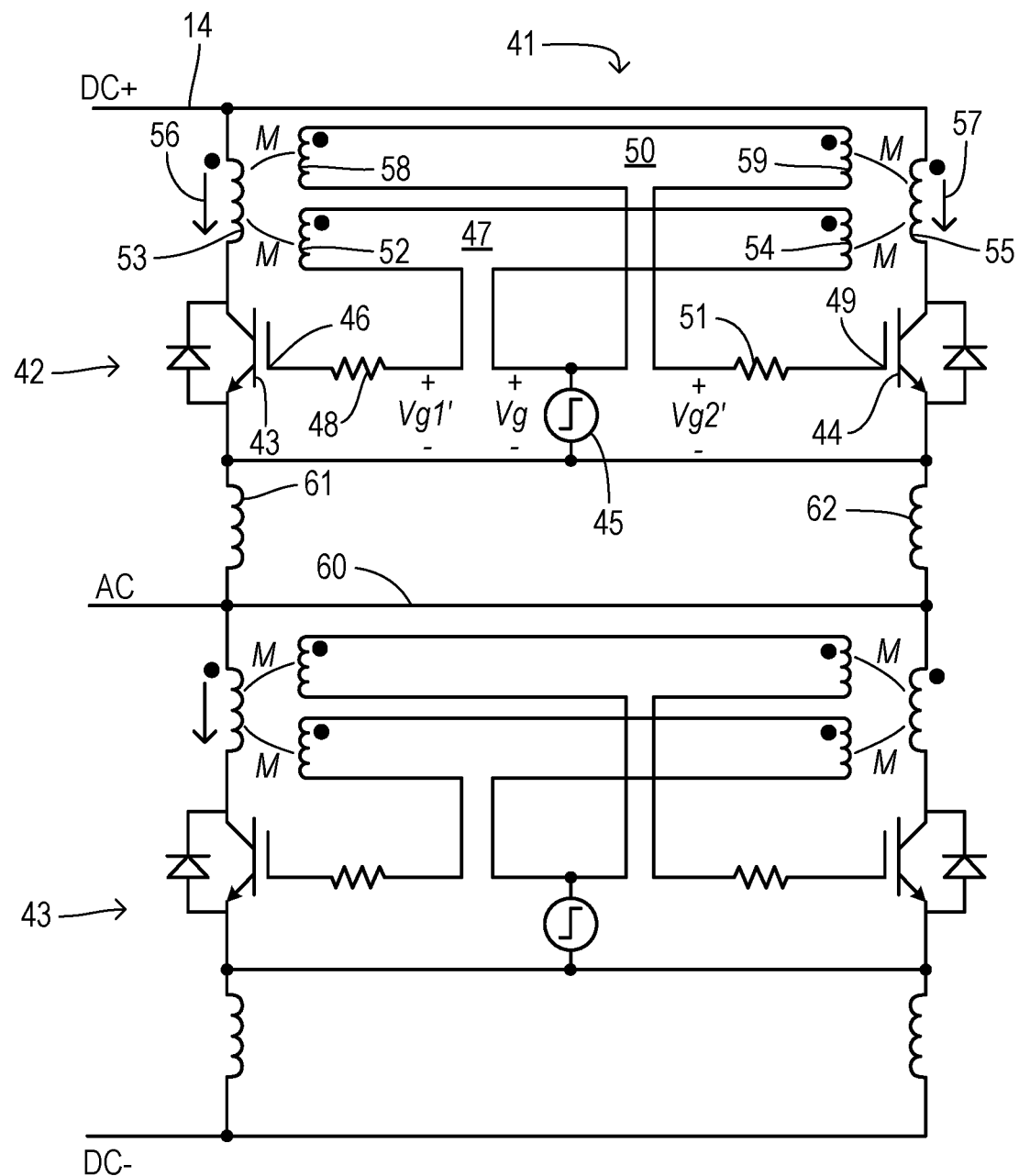
FIG. 4 is a schematic diagram of a phase leg with upper and lower half legs each having two parallel phase leg transistors, wherein each transistor receives a gate drive signal via an individual feedback loop.

To reduce imbalances, a shared gate drive signal for the paralleled switching devices is passed through separate gate feedback loops that are adapted to counteract any current imbalances within a half leg. FIG. 4 shows a first embodiment of the invention wherein a phase leg 41 has an upper half leg 42 and a lower half leg 43. Since each half leg implements similar feedback loops, only half leg 42 will be discussed in detail.

Half leg 42 has two parallel switching devices 43 and 44 (each an IGBT with an anti-parallel diode) connected between positive DC bus 14 and an AC output junction 60. A gate driver 45 generates a nominal PWM gate drive signal ($V_g$) used to simultaneously control IGBTs 43 and 44. Gate drive signal $V_g$ is coupled to a gate terminal 46 of IGBT 43 by a feedback loop 47 and a gate resistor 48. Gate drive signal $V_g$ is coupled to a gate terminal 49 of IGBT 44 by a feedback loop 50 and a gate resistor 51. Feedback loop 47 has a first mutual inductance M with a current path 56 (e.g., the collector current) of IGBT 43 via magnetic coupling based on proximity between a conductor (e.g., winding) 52 in feedback loop 47 and a conductor 53 in the power loop of IGBT 43. Feedback loop 47 has a second mutual inductance M with a current path 57 (e.g., the collector current) of IGBT 44 via magnetic coupling based on proximity between a conductor (e.g., winding) 54 in feedback loop 47 and a conductor 55 in the power loop of IGBT 44. Windings 52 and 54 function as current sensors for comparing the relative magnitudes of the parallel switching devices. The first and second mutual inductances are arranged to generate opposing voltages in first feedback loop 47 (the polarities indicated by the dots at windings 52 and 54 are connected in opposition), whereby inequalities in current magnitudes of IGBTs 43 and 44 are reduced. Specifically, when the output currents of IGBTs 43 and 44 are equal, then each winding 52 and 54 has the magnitude of induced voltage. The induced voltages cancel, and the gate drive signal is unaffected. On the other hand, if a current in path 56 of IGBT 43 increases faster than the current in path 55 of IGBT 44 during a turn-on transient then the gate drive signal delivered by feedback loop 47 to gate terminal 46 is reduced, thereby slowing down the current rise in path 56.

Feedback loop 50 has a first mutual inductance M with current path 57 of IGBT 44 via magnetic coupling based on proximity between a conductor (e.g., winding) 59 in feedback loop 50 and conductor 55 in the power loop of IGBT 44. Feedback loop 50 has a second mutual inductance M with current path 567 of IGBT 43 via magnetic coupling based on proximity between a conductor (e.g., winding) 58 in feedback loop 50 and conductor 53 in the power loop of IGBT 43. Windings 58 and 59 likewise function as current sensors for comparing the relative magnitudes of the parallel switching devices. The first and second mutual inductances are arranged to generate opposing voltages in feedback loop 50 (the polarities indicated by the dots at windings 58 and 59 are connected in opposition), whereby inequalities in current magnitudes of IGBTs 43 and 44 are reduced. Continuing the above example when a current in path 56 of IGBT 43 increases faster than the current in path 55 of IGBT 44 during a turn-on transient, the gate drive signal delivered by feedback loop 50 to gate terminal 49 is increased, thereby speeding up the current rise in path 57. Thus, whichever IGBT carries an increased current, its gate drive signal is automatically reduced and the gate drive signal to the other IGBT is increased.

More specifically, the relationships between the nominal gate drive signal $V_g$ and the actual drive signals $V_{g1}'$ and $V_{g2}'$ delivered to gate resistors 48 and 51 are as follows:

$$V_{g1}' = V_g - M \cdot \left( \frac{di_{c1}}{dt} - \frac{di_{c2}}{dt} \right) \text{ and}$$

$$V_{g2}' = V_g - M \cdot \left( \frac{di_{c2}}{dt} - \frac{di_{c1}}{dt} \right)$$

where $i_{c1}$ is the power loop current of IGBT 43 and $i_{c2}$ is the power loop current of IGBT 44.

IGBTs 43 and 44 are coupled to junction 60 by inductances 61 and 62, respectively. As previously discussed, magnetic coupling of inductances 61 and 62 with the respective gate terminals can be used to reduce switching losses.

Figure 5:
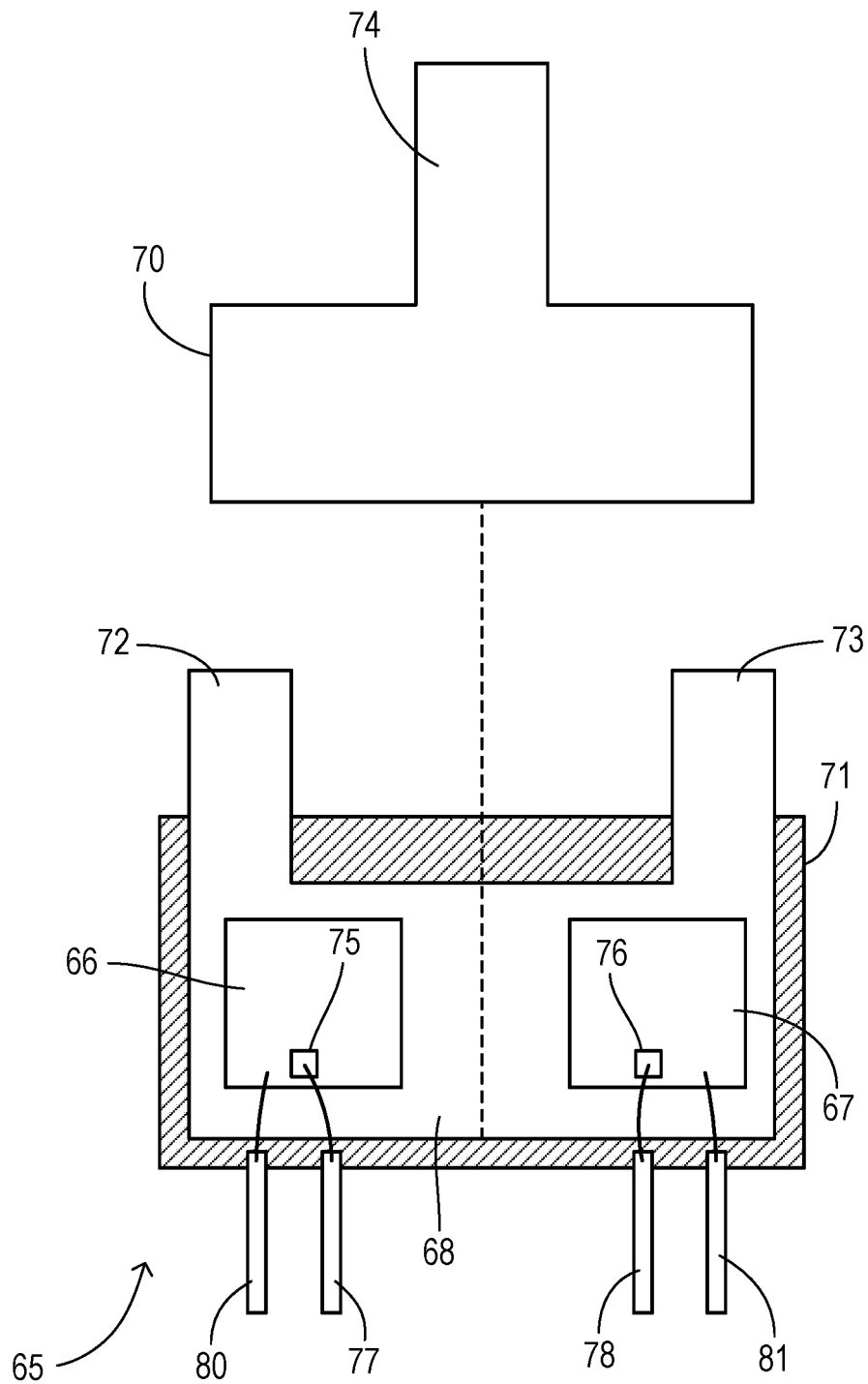
FIG. 5 is a partially exploded, top view of a power module package with two switching devices in parallel.
Figure 6:
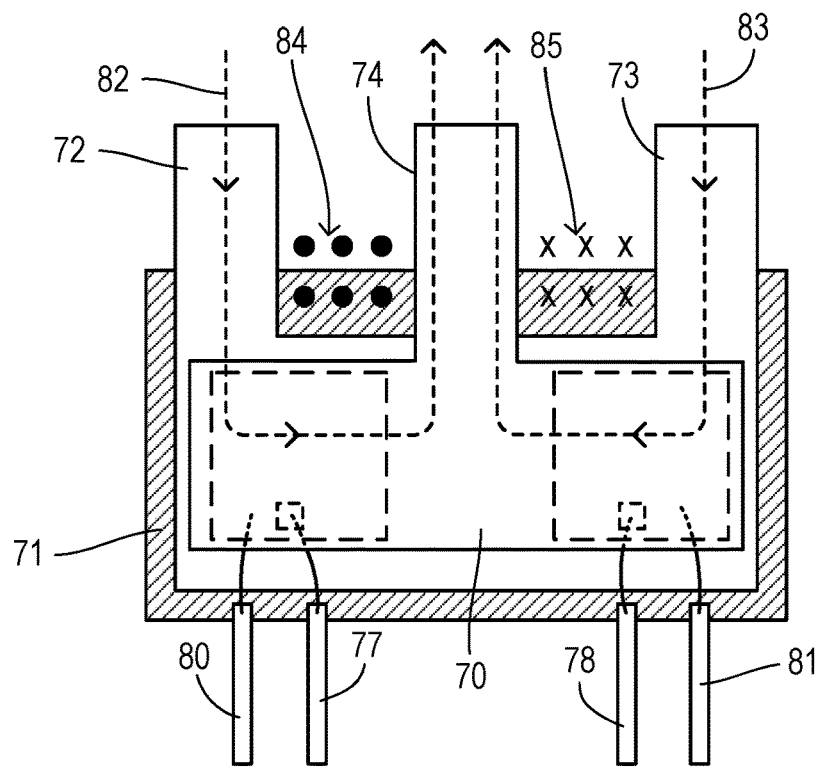
FIG. 6 is a top view of the power module package of FIG. 5 showing the power loop currents and the corresponding regions of induced magnetic flux.
Figure 7:
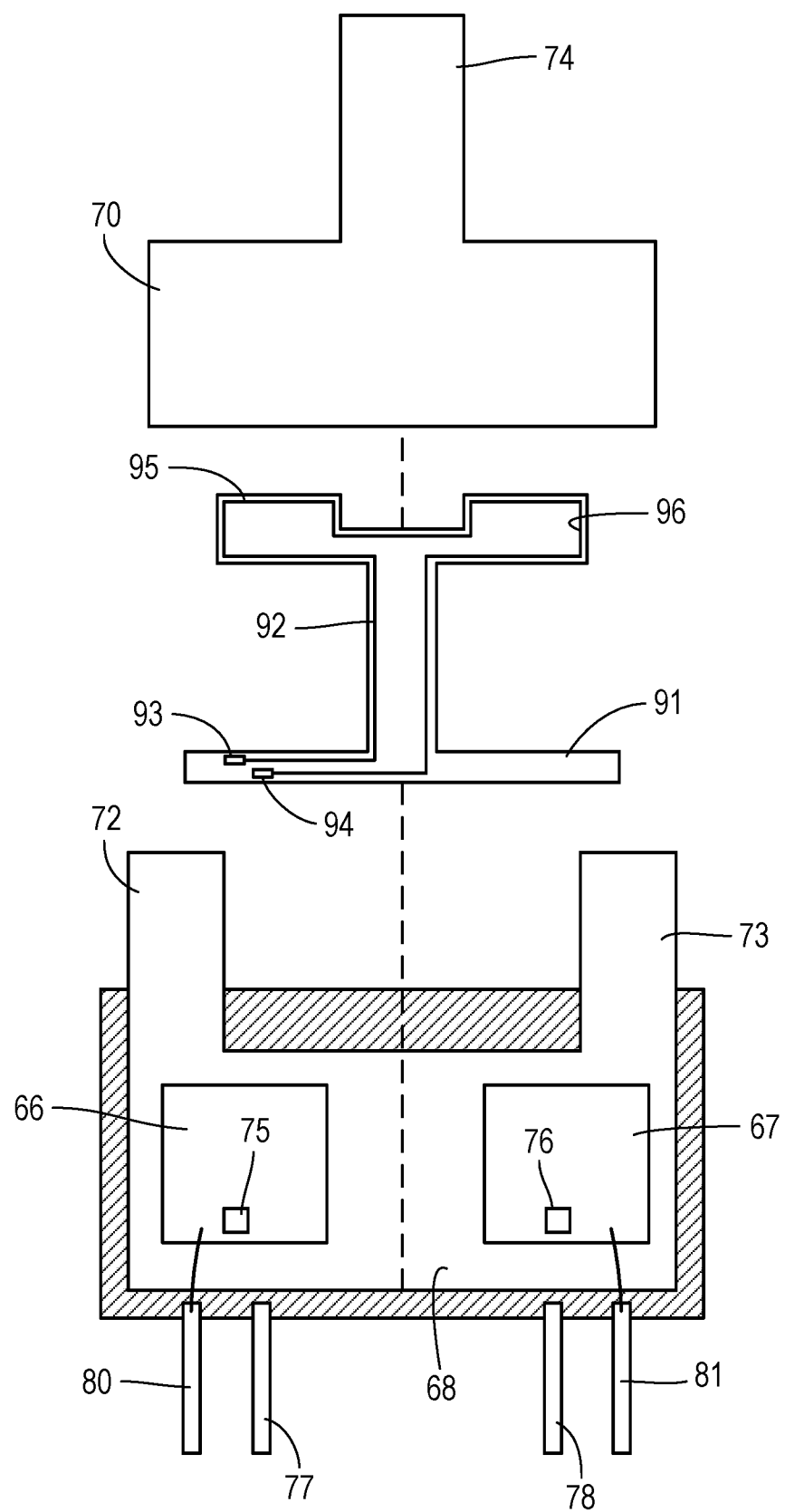
FIG. 7 is a partially exploded, top view of a power module package with a gate feedback loop formed by traces on a circuit board.

The mutual inductances introduced in the feedback loops can be implemented using various methods according to the type of switching devices being used. FIGS. 5-7 show a power module package in the form of a transfer-molded power module (TPM) implementing one half leg comprising two parallel IGBTs. The transistor dies, diodes, and electrical interconnects (e.g., a lead frame) of a TPM power module are encapsulated in an overmolded plastic body. In this particular embodiment, the feedback loops can be integrated onto a printed circuit board (PCB) placed inside the power module carrying traces that form windings for the feedback loops. The power module package can alternatively use other fabrication technologies such a direct bonded copper (DBC) substrates with similar PCBs for the feedback loops.

FIGS. 5 and 6 shows a prior art 2-in-1 TPM power module 65 with transistor dies 66 and 67 having their (lower) collector sides mounted (e.g., soldered) to a first plate or paddle 68 of a leadframe. A second plate or paddle 70 of the leadframe is soldered to the (upper) emitter sides of transistor dies 66 and 67 (e.g., via a jumper, not shown). Plate 70 is shown at an exploded position in FIG. 5. An encapsulating body 71 is shown in cross section. Plate 68 extends to terminals 72 and 73, and plate 70 extends to a terminal 74. When used as an upper half leg, for example, terminals 72 and 73 are connected to a positive power rail (DC+) of an inverter and terminal 74 is connected to the output junction (AC) of the phase leg. Transistor dies 66 and 67 have gate pads 75 and 76 connected to gate pins 77 and 78, respectively, via short wires bonded to the gate pads and pins. Kelvin emitter pins 80 and 81 are connected to the emitter sides of transistor dies 66 and 67, respectively, by bonded wires.

FIG. 6 shows current flow paths 82 and 83 (i.e., power loop currents) when transistor dies 66 and 67 are conducting as a result of a gate drive signal applied to pins 77 and 78. The turning of paths 82 and 83 induces magnetic flux 84 and 85 concentrated in regions between terminals 72 and 74 and between terminals 73 and 74 (dots represent the flux coming out of the page and the crosses represent the flux going into the page).

Figure 8:
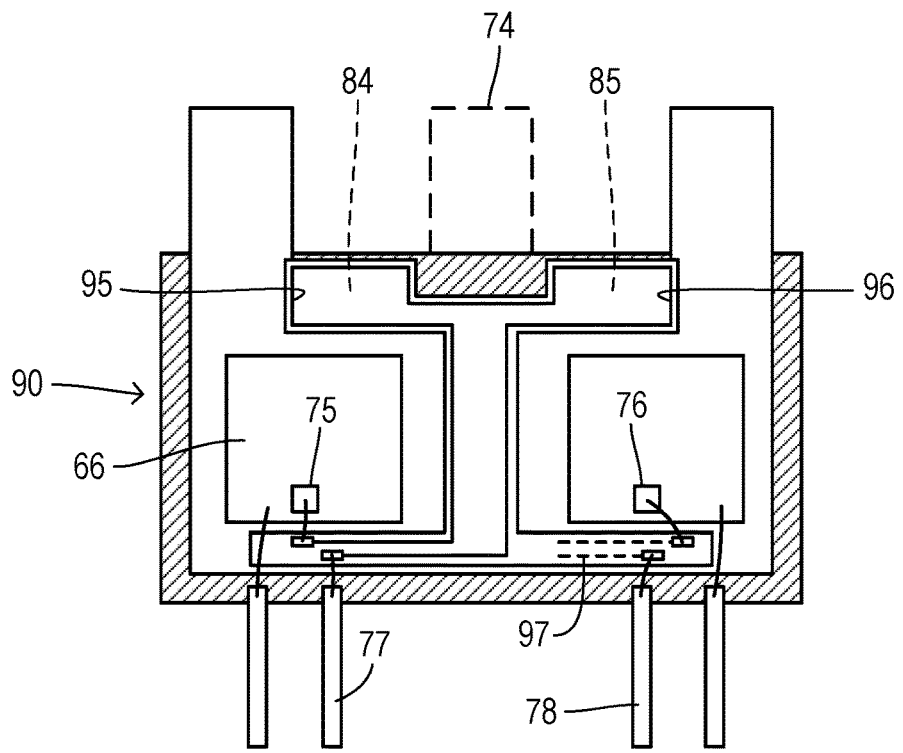
FIG. 8 is a top view of the power module package of FIG. 7 with the gate feedback loop located in the regions of induced magnetic flux.

FIGS. 7 and 8 show a 2-in-1 TPM power module 90 according to a first embodiment of the invention wherein the connection between each of the gate pads and the gate pins are diverted to form a winding that passes within the concentrated magnetic flux regions. FIGS. 7 and 8 are shown as a modification of the TPM module shown in FIGS. 5 and 6. Unmodified elements are shown with the same reference numbers.

For forming respective winding portions of the feedback loops coupling the nominal PWM gate drive signal to each gate pad (i.e., gate terminal) of a respective transistor, a generally H-shaped substrate (e.g., a PCB substrate) 91 is provided with circuit traces following a diversion path for the respective gate signals. For transistor 66, substrate 91 includes a trace 92 extending between end pads 93 and 94. Pad 93 is connected to gate pad 75 with a bonded wire, and pad 94 is connected to gate pin 77 by a bonded wire. Trace 92 includes a winding loop 95 arranged to occupy flux region 84 and a winding loop 96 arranged to occupy flux region 85. In order to provide canceling of currents induced in windings 95 and 96 when the transistors are carrying equal current, windings 95 and 96 have substantially equal dimensions and are placed substantially symmetrically with respect to the power loop currents. Since the flux regions have opposite directions, windings 95 and 96 are wound in the same (e.g., counterclockwise) direction so that the induced voltages tend to cancel. For transistor 67, substrate 91 may have circuit traces/pads 97 on the opposite side with a corresponding arrangement.

Figure 9:
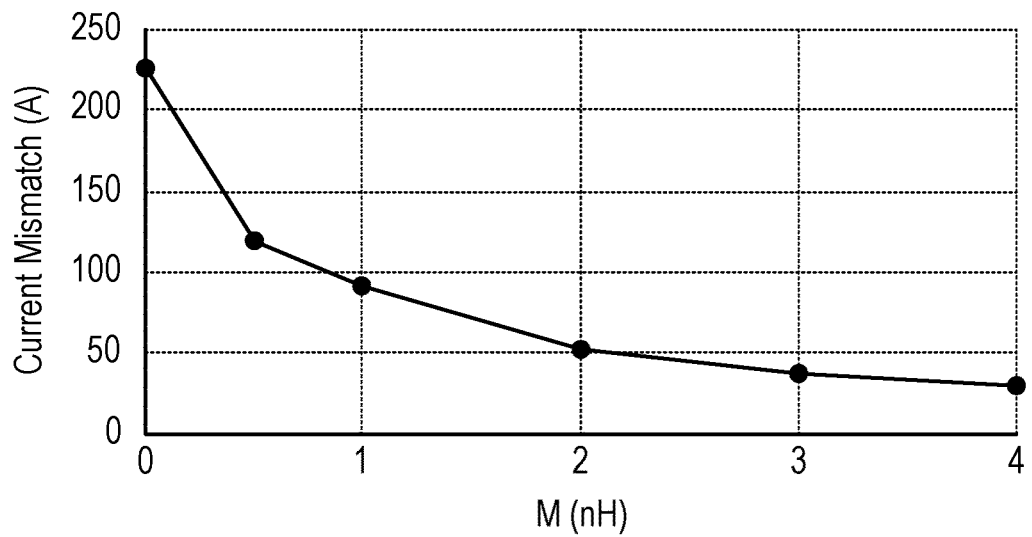
FIG. 9 is a graph showing a relationship between the mutual inductances of the feedback loop and the drop in current mismatch.

The size and number of winding turns for each of the feedback loops can be appropriately adjusted to achieve a desired value of mutual inductance. As mentioned above, a difference in the gate threshold voltages of 1V results in one prior art embodiment to a current imbalance of 227 A. Adding the feedback loop of the present invention using a mutual inductance M of 2 nH for each winding, then the current imbalance is reduced by about 77%, to 53A. FIG. 9 shows that the current imbalance can be reduced even more with higher values of mutual inductance M.

Figure 10:
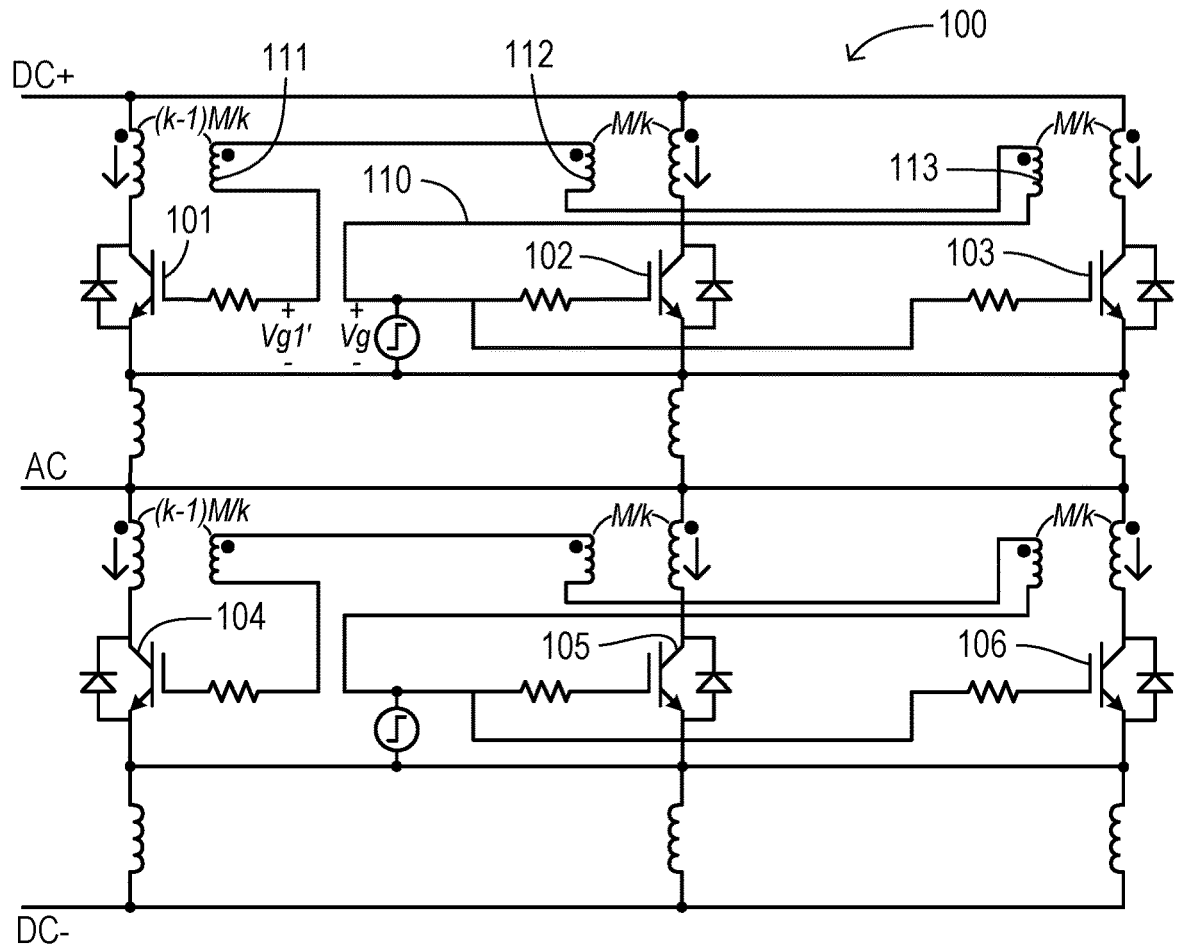
FIG. 10 is a schematic diagram of a phase leg with upper and lower half legs each having three parallel phase leg transistors, showing a feedback loop for one transistor magnetically coupled to the power loop currents of all three transistors.

For higher current capacity, a half leg may include more than two paralleled switching devices. FIG. 10 shows an alternative embodiment for a phase leg 100 wherein the upper half leg includes three parallel IGBTs 101, 102, and 103 and the lower half leg includes three parallel IGBTs 104, 105, and 106. In general, a half leg can include k devices, where k>2. For simplicity, gate feedback loops are shown only for IGBTs 101 and 104 since all the feedback loops can have the same structure and function.

The feedback loop for each switching device compares the changing current of one particular switching device to the average current change of the other k switching devices. Thus, feedback loop 110 (supplying the gate signal $V_g$ to first IGBT 101) has a mutual inductance of $$(k-1)\frac{M}{k}$$

between loop 110 and IGBT 101 via a winding 111. Feedback loop 110 also has a respective mutual inductance with each of the other k switching devices having a value of $$\frac{M}{k}$$

(e.g., via a winding 112 for IGBT 102 and a winding 113 for IGBT 103). Thus, the sum of the mutual inductances which are coupled to the current paths for the switching devices other than the one which is driving by the respective feedback loop is substantially equal to the mutual inductance that the respective feedback loop has with the current path of the switching device which is being driven by the feedback loop. Consequently, when the current gradient of the driven IGBT is about equal to the average current gradient of the other k IGBTs then the induced voltages in the feedback loop substantially cancel. Otherwise, the gate drive voltage supplied to the controlled IGBT is increased or decreased according to the current mismatch.

More specifically, if the changing collector current of the first switching device $$\frac{di_{c1}}{dt}$$

is higher than the average value $$\frac{d(i_{c1} + i_{c2} + \ldots + i_{ck})}{k \cdot dt},$$

then gate voltage Vg1' to IGBT 101 shall be reduced by the coupling mechanism to slow down the current rising of IGBT 101 to help with current balancing, and vice versa. This is represented by the following equation:

$$V'_{g1} = V_g - M \cdot \left(\frac{di_{c1}}{dt} - \frac{d(i_{c1} + i_{c2} + \ldots + i_{ck})}{k \cdot dt}\right) =$$
$$V_g - \left(M \cdot \frac{k-1}{k} \cdot \frac{di_{c1}}{dt} - M \cdot \frac{1}{k} \cdot \frac{di_{c2}}{dt} - \ldots - M \cdot \frac{1}{k} \cdot \frac{di_{ck}}{dt}\right)$$

Figure 11:
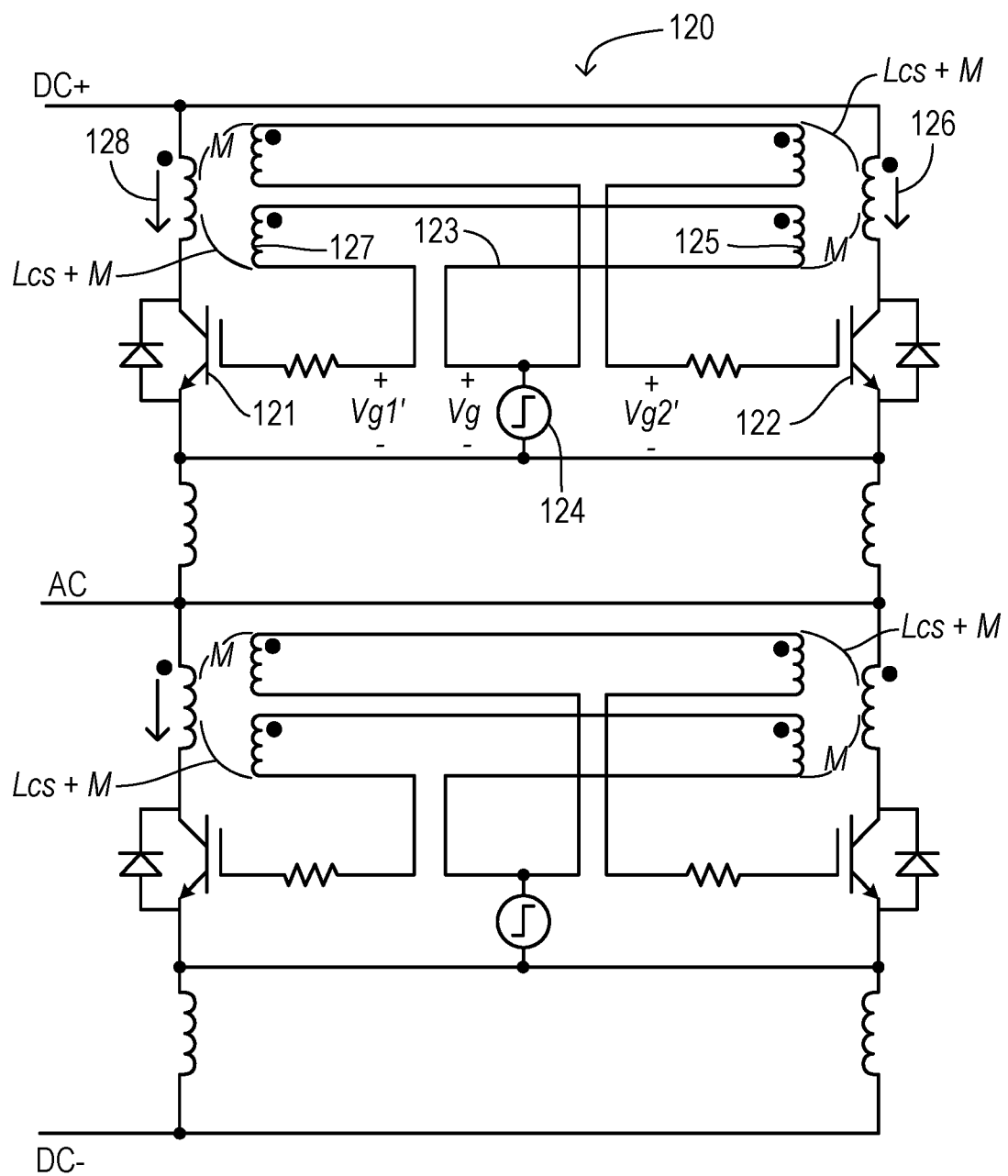
FIG. 11 is a schematic diagram of a phase leg with upper and lower half legs each having two parallel phase leg transistors, wherein each individual feedback loop further provides an additional mutual inductance with the matching transistor for reducing switching loss.

In yet another embodiment shown in FIG. 11, mutual inductances for improving current balancing can be combined with a mutual inductance for reducing power loss. A phase leg 120 has upper half leg switching devices comprised of IGBTs 121 and 122. A gate feedback loop 123 conducts a nominal gate drive signal from a gate drive 124 to the gate of IGBT 121 via a winding 125 coupled to current path 126 of IGBT 122 and a winding 127 coupled to current path 128 of IGBT 121. The mutual inductance of winding 125 with current path 126 has a value of M. The mutual inductance of winding 127 with current path 128 has a value of M+$L_{CS}$, where $L_{CS}$ is the desired common source inductance for reducing switching loss. By virtue of the selected mutual inductances, the modified gate voltage for the first IGBT 121 is as follows:

$$V'_{g1} = V_g - \left[(L_{CS} + M) \cdot \frac{di_{c1}}{dt} - M \cdot \frac{di_{c2}}{dt}\right]$$

Figure 12:
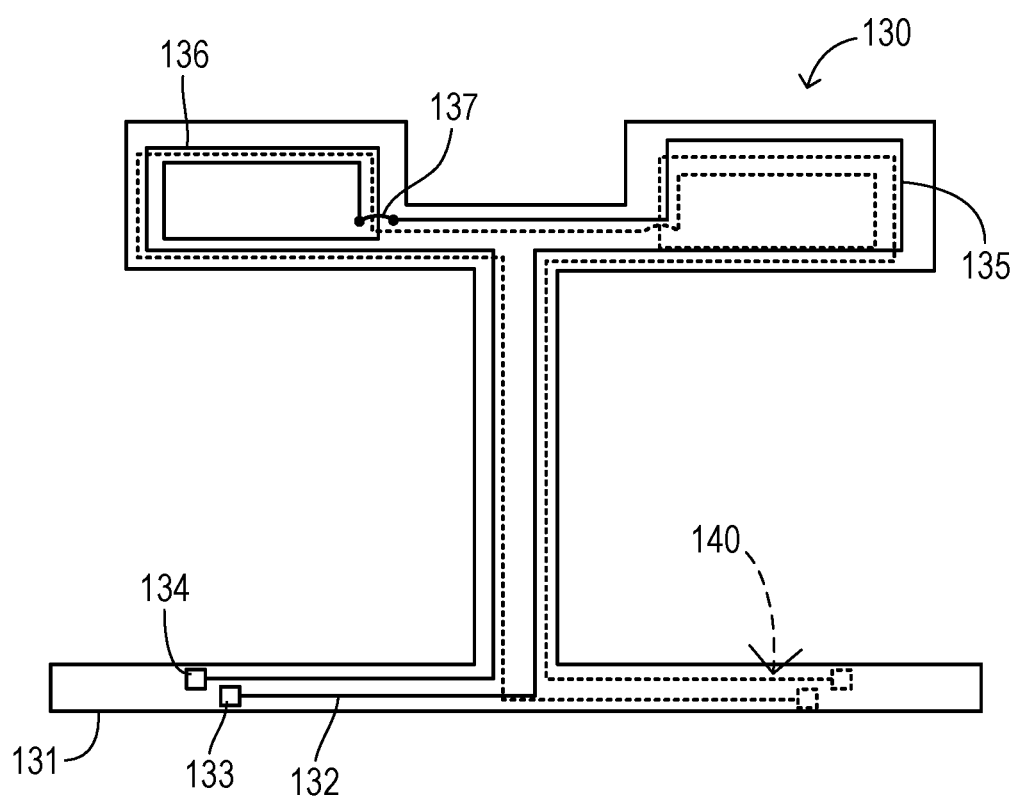
FIG. 12 is a top view showing the printed circuit board of FIG. 7 showing traces for feedback loops in greater detail.

FIG. 12 shows a circuit element 130 for implementing the integrated inductances for current balancing and power loss reduction adapted for the 2-in-1 TPM power module of FIGS. 7 and 8. An H-shaped substrate 131 carries a circuit trace 132 between end pads 133 and 134 for a first feedback loop including a winding 135 and a winding 136. Winding 135 is shown with a single turn for coupling with the current path (e.g., collector) of one of the other switching devices (i.e., one not controlled via this particular feedback loop). The single turn is configured to provide a mutual inductance M. Winding 136 has multiple turns for coupling with the current path of the controlled device, wherein the size and number of turns are configured to provide a mutual inductance M+$L_{CS}$. In order to accommodate multiple turns, a jumper 137 can be used. A similar feedback loop 140 with corresponding windings for controlling to other parallel switching device in the power module is provided on the opposite side of substrate 131.

What is claimed is:

1. A pulse width modulated (PWM) power converter comprising:
    a DC link with positive and negative buses configured to receive a DC supply voltage;
    a phase leg comprising an upper half leg and a lower half leg coupled in series between the buses, wherein a junction between the half legs is configured to be coupled to a load, wherein each half leg is comprised of first and second switching devices connected in parallel;
    a gate driver generating a nominal PWM gate drive signal for driving both respective first and second switching devices in a respective half leg; and
    a first feedback loop coupling the nominal PWM gate drive signal to a gate terminal of the respective first switching device, wherein the first feedback loop has a first mutual inductance with a current path of the respective first switching device and has a second mutual inductance with a current path of the respective second switching device, wherein the first and second mutual inductances are arranged to generate opposing voltages in the first feedback loop, whereby inequalities in current magnitudes of the respective first and second switching devices are reduced;

wherein the respective half leg is further comprised of a third switching device connected in parallel with the respective first and second switching devices, wherein the first feedback loop further comprises a third mutual inductance with a current path of the third switching device, wherein a sum of the second and third mutual inductances is substantially equal to the first inductance, and wherein the second and third mutual inductances are each arranged to generate voltages in the first feedback loop that oppose a voltage generated by the first mutual inductance.

2. The power converter of claim 1 wherein the first mutual inductance is comprised of a first winding in the first feedback loop magnetically coupled to the respective current path of the first switching device, and wherein the second mutual inductance is comprised of a second winding in the first feedback loop magnetically coupled to the respective current path of the second switching device.

3. The power converter of claim 1 wherein the first mutual inductance includes a common source inductance of the first switching device.

4. The power converter of claim 1 wherein the first feedback loop further includes a loss-reduction mutual inductance with the current path of the first switching device.

5. The power converter of claim 4 wherein the first mutual inductance and the loss-reduction mutual inductance are generated by a multi-turn winding magnetically coupled to the current path of the first switching device.

6. The power converter of claim 1 further comprising second and third phase legs with respective half legs each including a plurality of parallel switching devices, wherein each switching device receives a respective gate drive signal via a respective feedback loop configured to balance currents within each respective half leg using mutual inductance of the respective feedback loop with current paths of each of the switching devices connected in parallel in the respective half leg.

7. The power converter of claim 1 wherein the first and second switching devices are comprised of a transfer-molded power module having a printed circuit board, wherein the first and second mutual inductances are comprised of conductive traces forming respective loops on the printed circuit board coinciding with regions of concentrated magnetic flux generated by current flow in the first and second switching devices.

8. A pulse width modulated (PWM) inverter for a traction motor in an electrified vehicle, comprising:
a DC link with positive and negative buses configured to receive a DC supply voltage;
a phase leg comprising an upper half leg and a lower half leg coupled in series between the buses, wherein a junction between the half legs is configured to be coupled to the traction motor, wherein each half leg is comprised of first and second switching devices connected in parallel;
a gate driver generating a nominal PWM gate drive signal for driving both respective first and second switching devices in a respective half leg; and
a first feedback loop coupling the nominal PWM gate drive signal to a gate terminal of the respective first switching device, wherein the first feedback loop has a first mutual inductance with a current path of the respective first switching device and has a second mutual inductance with a current path of the respective second switching device, wherein the first and second mutual inductances are arranged to generate opposing voltages in the first feedback loop, whereby inequalities in current magnitudes of the respective first and second switching devices are reduced;

wherein the respective half leg is comprised of at least one additional switching device connected in parallel with the respective first and second switching devices, wherein the first feedback loop further comprises an additional mutual inductance with a current path of each respective additional switching device, wherein a sum of the additional mutual inductances and the second mutual inductance is substantially equal to the first inductance, and wherein the additional mutual inductances and the second mutual inductance are each arranged to generate voltages in the first feedback loop that oppose a voltage generated by the first mutual inductance.

9. The inverter of claim 8 wherein the first mutual inductance is comprised of a first winding in the first feedback loop magnetically coupled to the respective current path of the first switching device, and wherein the second mutual inductance is comprised of a second winding in the first feedback loop magnetically coupled to the respective current path of the second switching device.

10. The inverter of claim 8 wherein the first mutual inductance includes a common source inductance of the first switching device.

11. The inverter of claim 8 wherein the first feedback loop further includes a loss-reduction mutual inductance with the current path of the first switching device.

12. The inverter of claim 11 wherein the first mutual inductance and the loss-reduction mutual inductance are generated by a multi-turn winding magnetically coupled to the current path of the first switching device.

13. The inverter of claim 8 further comprising second and third phase legs with respective half legs each including a plurality of parallel switching devices, wherein each switching device receives a respective gate drive signal via a respective feedback loop configured to balance currents within each respective half leg using mutual inductance of the respective feedback loop with current paths of each of the switching devices connected in parallel in the respective half leg.

14. The inverter of claim 8 wherein the first and second switching devices are comprised of a transfer-molded power module having a printed circuit board, wherein the first and second mutual inductances are comprised of conductive traces forming respective loops on the printed circuit board coinciding with regions of concentrated magnetic flux generated by current flow in the first and second switching devices.

15. The inverter of claim 14 wherein the switching devices are comprised of insulated gate bipolar transistors.

16. A pulse width modulated (PWM) power converter comprising:
a DC link with positive and negative buses configured to receive a DC supply voltage;
a phase leg comprising an upper half leg and a lower half leg coupled in series between the buses, wherein a junction between the half legs is configured to be coupled to a load, wherein each half leg is comprised of first and second switching devices connected in parallel;

a gate driver generating a nominal PWM gate drive signal for driving both respective first and second switching devices in a respective half leg; and a first feedback loop coupling the nominal PWM gate drive signal to a gate terminal of the respective first switching device, wherein the first feedback loop has a first mutual inductance with a current path of the respective first switching device and has a second mutual inductance with a current path of the respective second switching device, wherein the first and second mutual inductances are arranged to generate opposing voltages in the first feedback loop, whereby inequalities in current magnitudes of the respective first and second switching devices are reduced;

wherein the respective half leg is comprised of at least one additional switching device connected in parallel with the respective first and second switching devices, wherein the first feedback loop further comprises an additional mutual inductance with a current path of each respective additional switching device, wherein a sum of the additional mutual inductances and the second mutual inductance is substantially equal to the first inductance, and wherein the additional mutual inductances and the second mutual inductance are each arranged to generate voltages in the first feedback loop that oppose a voltage generated by the first mutual inductance.

* * * * *